United States Patent [19]

Eastmond

[11] Patent Number: 4,975,657
[45] Date of Patent: Dec. 4, 1990

[54] SPEECH DETECTOR FOR AUTOMATIC LEVEL CONTROL SYSTEMS

[75] Inventor: Bruce C. Eastmond, Downers Grove, Ill.

[73] Assignee: Motorola Inc., Schaumburg, Ill.

[21] Appl. No.: 430,687

[22] Filed: Nov. 2, 1989

[51] Int. Cl.$^5$ ............................................. H03G 3/30
[52] U.S. Cl. .................................... 330/279; 307/358; 381/46
[58] Field of Search ........................ 307/358; 328/117; 381/46; 455/219, 221, 222, 223, 224; 330/278, 279, 129

[56] References Cited

U.S. PATENT DOCUMENTS 3,502,993 3/1970 Schürzinger et al. .......... 307/358 X
4,631,737 12/1986 Davis et al. ..................... 307/358 X Primary Examiner—James B. Mullins
Attorney, Agent, or Firm—Joseph L. Krause; Anthony J. Sarli; Steven J. Parmalee

[57] ABSTRACT

A speech detection circuit uses a peak detector and a valley detector including offset voltages to reliably detect the absence or presence of speech at audio base band level. This circuit provides a pulse train output when speech is detected which may be used to control an automatic gain control circuit.

8 Claims, 3 Drawing Sheets

SPEECH DETECTOR FOR AUTOMATIC LEVEL CONTROL SYSTEMS

BACKGROUND OF THE INVENTION

This invention is directed generally to systems that provide automatic gain control for speech signals. In particular, this invention is directed to improving the performance of automatic gain control systems that depend upon the detection of speech signals to function properly, such the automatic level control (ALC) circuit of U.S. Pat. No. 4,514,703 issued to Maher et al. This circuit may also have applications wherever speech detection is required.

Conventional AGC systems produce a nearly constant amplitude output speech signal as input speech signals vary in amplitude. However, conventional AGC circuits increase gain when the input signal ceases because there is no speech present upon which the AGC system can operate. In most audio systems, the only signal present in the absence of a speech signal, is background noise. Since there is no signal present, the background noise is amplified by the audio system as the AGC it increases its gain.

To overcome the limitations with conventional AGC systems, some AGC systems incorporate an automatic level control, or ALC, that detects speech and allows the AGC system gain to vary freely in the presence of a speech signal. In the absence of a speech signal, the ALC circuitry, which generally includes speech detection circuits, hold the system gain constant until a speech signal reappears at the AGC circuit input. A prior art AGC system including an ALC, can be seen in U.S. Pat. No. 4,541,703. The ALC system disclosed in this patent includes a speech detector that holds the gain adjustment of the AGC circuitry constant when speech is not present at the audio input terminal.

A problem with the ALC of Maher, however, is its inability, under certain operating conditions, to distinguish between certain types of background noise and actual speech. In particular, it was found that vehicular noise may be confused with speech, resulting in periods of continuous AGC operation following pauses in speech. This circuit produced changes in gain that resulted in the occurrence of loud intersyllabic noise bursts as the AGC increased the gain level in response to background noise.

An ALC circuit that can detect speech more reliably and which could be used to control the gain of an AGC circuit would be an improvement over the prior art. Such circuit would differentiate between background noise more reliably, detecting speech peaks and background noise levels to control AGC circuitry.

SUMMARY OF THE INVENTION

There is provided herein a circuit that produces output pulses indicating the presence of speech on a communication resource (such as an RF channel from a radio). The pulses are produced when speech signals exceed the average noise level on the channel and the average peak value of audio present on the channel.

In one embodiment, the circuit includes a peak detector that detects voltage peaks in speech signals and a valley detector that detects the average background noise level present in the audio signal. A voltage comparator compares the output level of the peak detector to the output level of the valley detector and produces a signal substantially equal to the greater of the two signals from the peak detector and the valley detector.

Offset voltage circuits at the output of both the peak detector and the valley detector, which are set below the peak detector output and set above the valley detector output, improve the certainty of the detection of speech signals by providing discrimination between slight fluctuations in the average noise level and slight fluctuations in the average peak level of audio signals.

An offset voltage circuit at the output of the peak detector reduces the output of the peak detector by approximately 15 millivolts. A second offset voltage circuit at the output of the valley detector increases the voltage from the output of the valley detector by approximately 200 millivolts. Audio signals input to the speech detector circuit that exceed the larger of either the decreased peak signal or the increased noise level are considered to be speech signals. An output signal is produced (which in the preferred embodiment was a binary-valued pulse) at the occurence of an input signal level exceeding the greater of the two aforementioned signals.

The offset levels (the amount by which the peak detector is increased) are chosen for a particular application to prevent false identification of speech signals and could be adjusted in either direction to increase or decrease the sensitivity of the circuit to speech signals on the channel.

DETAILED DESCRIPTION OF THE PREFERRED EMBODIMENT

Figure 1:
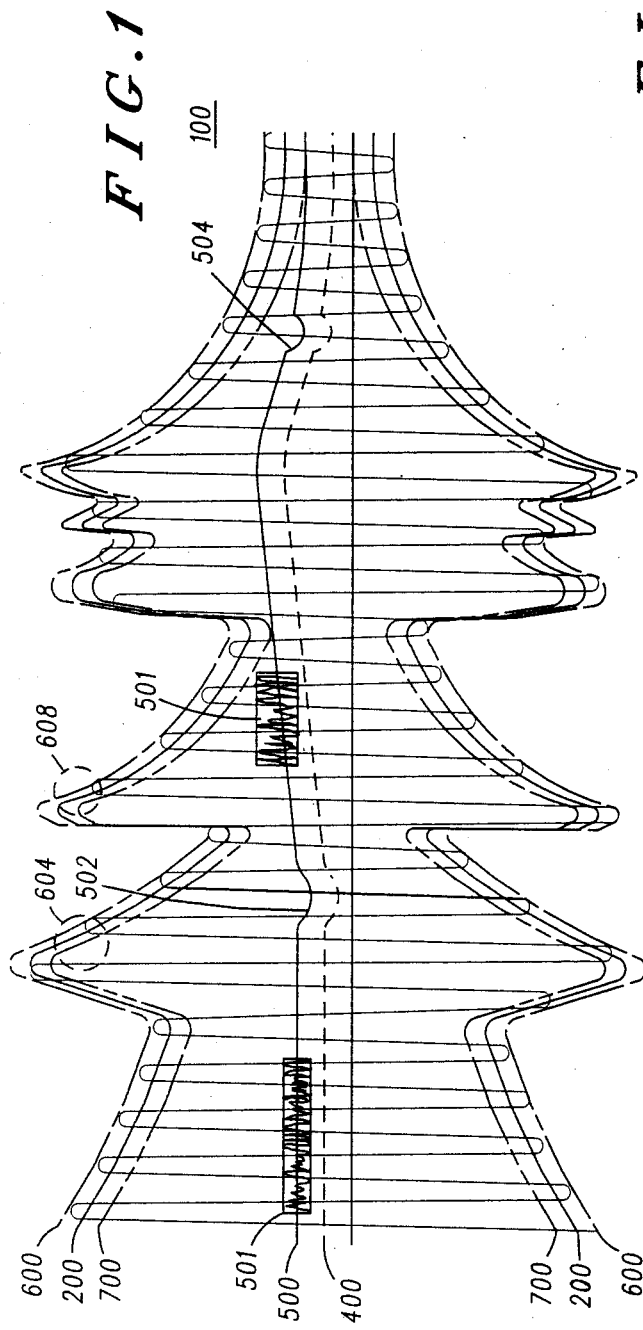
FIG. 1 shows a speech envelope pattern.

FIG. 1 shows a typical speech waveform (200) from the audio output stages of a communications device such as a radio. The speech waveform (200) represents the waveform produced by a speech signal and is normally a signal at audio or baseband frequencies. The amplitude of the waveform (200) (which in FIG. 1 is assumed to be measured in volts) changes over time with respect to a reference level (300), which is typically zero volts but may be at other bias levels as well.

In virtually all communication channels, noise will be present in the audio signal from many sources including the communication channel itself as well as the electronic components. This background noise is always present and is represented in FIG. 1 by the low amplitude signal excursions (501) present in the waveform (200). The background noise will have an average signal level (500) that stays relatively constant but which may occasionally fluctuate in either direction (502 and 504). A speech envelope processor that can distinguish speech from noise must base it's identification of speech on the relative levels of noise and speech on the channel.

Figure 2:
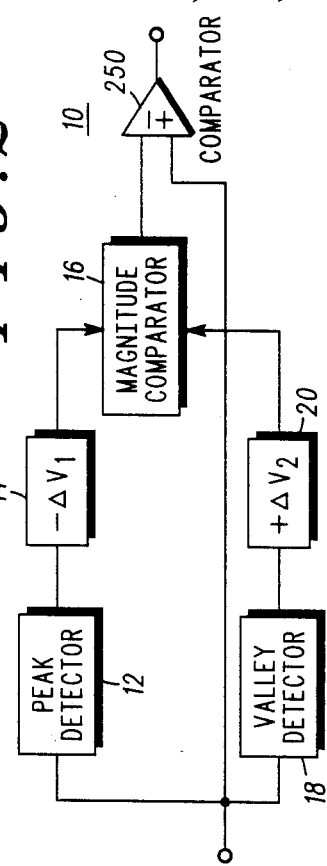
FIG. 2 shows a block diagram of the functional blocks of the preferred embodiment.

FIG. 2 shows a block diagram of an envelope processor (10) that detects speech in preprocessed audio signals, including possibly those shown in FIG. 1. The envelope processor (10) is comprised of a peak detector (12) that receives preprocessed audio signals, followed by a first offset voltage generator (14). A valley detector (18), which also receives the preprocessed input audio signals, is followed by a second offset voltage generator (20). The outputs of the first offset voltage generator (14) and of the second offset voltage generator (20) are coupled to a magnitude comparator (16), the output of which is the greater of the two signals from the offset voltage generators (14 and 20).

The peak detector (12) detects the peak excursions of a waveform such as the waveform (200) shown in FIG. 1. The peak detector (12) is designed to have a relatively fast attack time and a somewhat slower decay time, permitting it to quickly respond to increases in the audio input level but to remember previous peak values of the audio input level when audio input levels drop off or when the speech signals temporarily disappear, which frequently occurs during normal speech. The attack time and decay time of the peak detector is established by charging a capacitor to the highest voltage level present in the signal from an amplifier but discharging the capacitor through a constant current source. The component values are empirically determined to provide the desired attack and decay times.

Figure 3:
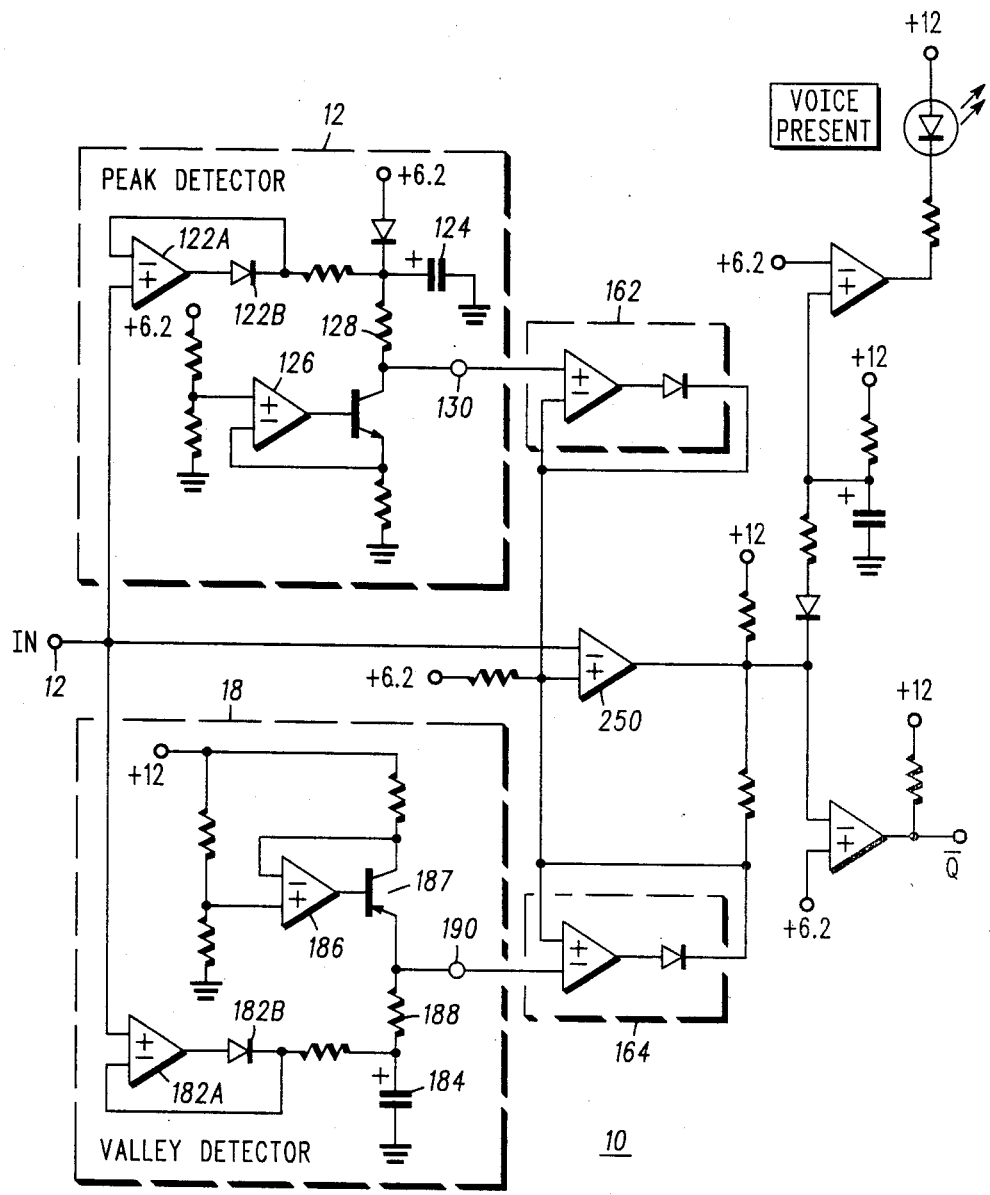
FIG. 3 shows a schematic diagram of a preferred embodiment of the invention.

Referring to the preferred embodiment of the peak detector (12) shown in FIG. 3, the operational amplifier (122A), which receives the audio signals, in combination with the rectifier (122B) with it's polarity as shown, will quickly charge the reference capacitor (124) to the highest voltage level present in the audio signal. When the average level in the audio signal decreases below the voltage on the capacitor (124), the charge on the reference capacitor (124) will discharge primarily through a constant current source comprised of an operational amplifier (126) in combination with an NPN transistor and appropriate bias resistors as shown. The current through the resistor 128 establishes a voltage drop across resistor 128 which acts as an offset voltage with respect to the output of the peak detector.

The peak detector (12) will produce an output voltage (600) as shown in FIG. 1 that generally follows the peak signal excursions of the waveform. The fast attack time will permit it to follow sudden changes in amplitude but the slower decay time, which can be seen in FIG. 1 in the segments labelled 604 and 608, prevents sudden decreases in the amplitude od the audio from greatly affecting the output of the peak detector.

The valley detector (18) is a circuit that tracks the average minimum of signal present on the communication channel. The valley detector (18) has a fast decay time, which permits it to respond to decreases in the average noise level quickly, and a slow attack time, which permits it to respond to increases in noise level much more slowly. The output of the valley detector is shown in FIG. 1 as a minimum signal level (400). The attack and decay times are established by the charging and discharging of a capacitor (184).

Referring to FIG. 3, the operational amplifier (182A), that receives audio signals in combination with the rectifier (182B) with it's polarity shown, will quickly discharge the capacitor (184) to the most negative value present in the input audio signal. Increases in audio signal above the voltage across the capacitor will cause the capacitor (184) to charge primarily through a constant current source comprised of an operational amplifier (186) in combination with a PNP transistor and appropriate bias resistors as shown. The current through the resistor 188 establishes a voltage drop across resistor 188 which acts as an offset voltage with respect to the output of the valley detector.

The certainty of the presence of speech is improved by the adjustment of the peak detector and valley detector outputs by the two offset voltages described above. Referring to FIG. 2, the two offset voltage generator circuits (14 and 20) reduce false triggering of the output comparator (250 in FIG. 3 and in FIG. 2) by providing a speech discrimination threshold which ranges between the background noise level on the communications channel and the peak audio level.

In FIG. 2, the outputs from the offset voltage circuits (14 and 20) are coupled to a first magnitude comparator (16), the output of which is the greater of the two signals from the offset voltage circuits. The output of the magnitude comparator is then coupled to a second comparator (250) that compares the greater of the two offset voltage circuit outputs to the audio signal on the communication channel.

If the audio signal on the communication channel exceeds the greater of the outputs of the two voltage circuits, the output of the second voltage comparator (250) will go active. If the audio signals on the communcation channel are less than the greater of the two offset voltages, the circuit considers speech signals to be absent.

Consider first, for example, a speech signal on the audio channel below the average noise level;i.e. below the output level of the valley detector. Such a speech signal would likely be unrecognizable and will not trigger the second comparator. Consider next a speech signal above the voltage level from the second offset voltage circuit (20) but less than the output of the first offset voltage circuit (14). As the peak detector' output voltage decays to the level of the speech, eventually the peak detector's output (reduced by the offset amount $\Delta V_1$) will be exceeded by the level of the audio on the communication channel. (The level of the first offset value will be greater than the level of the second offset value). As speech signals on the communication channel exceed the level of the first offset circuit's output voltage, the output of the second voltage comparator will go active providing a signal that indicates speech is present.

In the preferred embodiment the first offset voltage, $\Delta V_1$, is 15 millivolts, shown in FIG. 1 by the voltage trace (700) that tracks the output voltage of the peak detector (600). In the preferred embodiment, the output of the valley detector is increased by $\Delta V_2$, which is 200 millivolts. In the preferred embodiment, the offset voltages $\Delta V_1$ and $\Delta V_2$ are established by the voltage drops across the resistors 128 and 188 shown in FIG. 3.

In FIG. 2, the magnitude comparator (16) is provided by a combination of ideal diodes which are shown in FIG. 3 as 162 and 164. Ideal diode 162 takes the output (130) of the peak detector and rectifies the output by means of the operational amplifier 162A in combination with the forward biased diode 162B. Similarly the ideal diode 164 receives the output (190) of the valley detector.

The ideal diodes (162 and 164) are connected as shown to the noninverting input terminal of the second voltage comparator (250) of FIG. 2. The ideal diodes (162 and 164) avoid temperature related changes in forward biased voltages and avoid the typical 0.6 volt drop across a silicon diode by the wiring of the operational amplifiers and diodes as shown.

Figure 4:
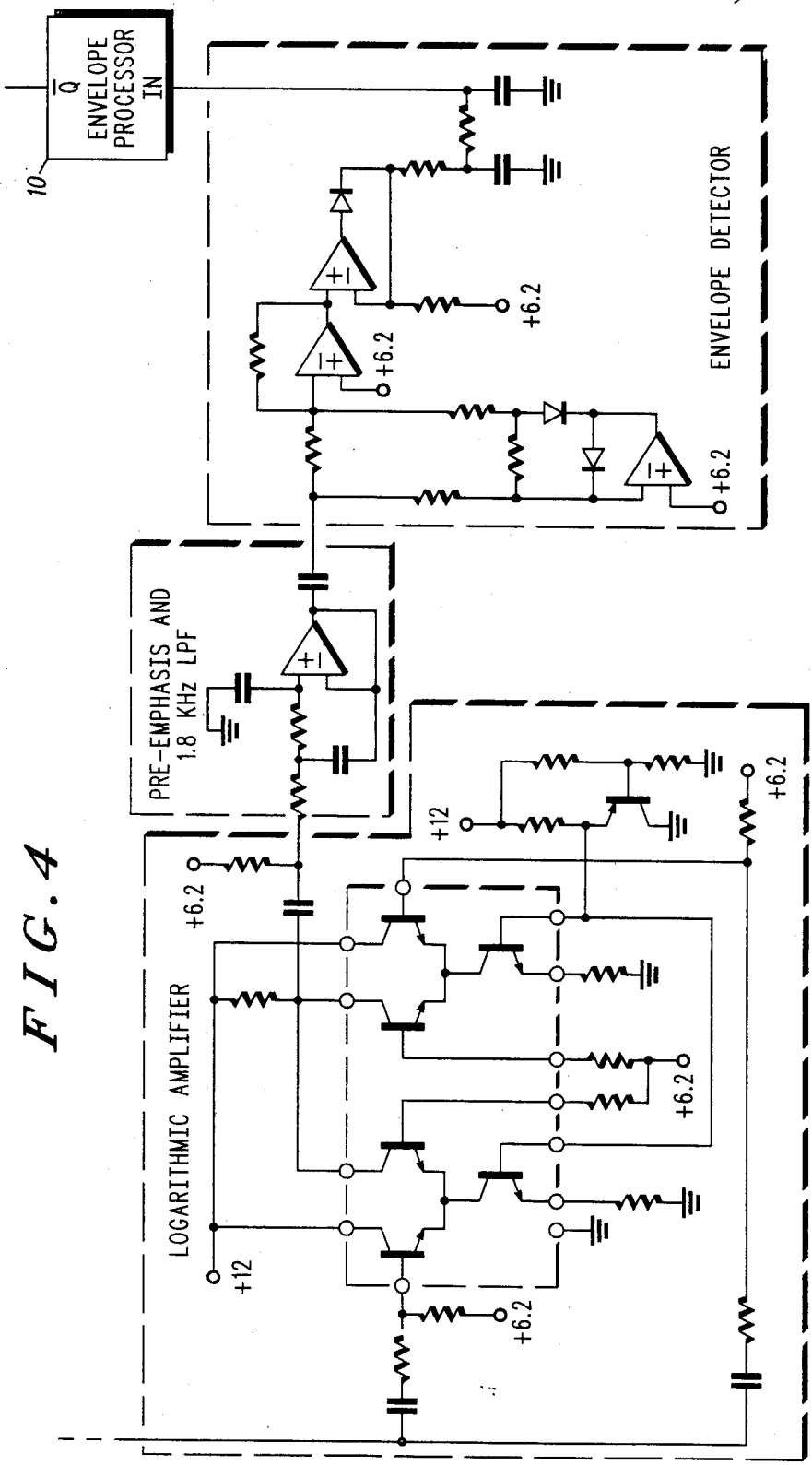
FIG. 4 shows a schematic diagram of speech processing circuits used with the preferred embodiment.

The preferred embodiment of the envelope processor (10) shown in FIG. 3 receives preprocessed audio signals at the input terminal (12) from circuitry shown in FIG. 4 which is shown in the Maher patent. The audio signals input to the envelope processor (10) are preferably logarithmically amplified to permit the circuit (10) to accomodate speech signals over widely varying amplitude ranges. The logarithmically amplified speech signals are then processed by a pre-emphasis circuit and a low-pass filter having a cutoff frequency which passes substantially all of the speech energy. The pre-emphasized and filtered audio signals are then enveloped detected and full-wave rectified before being input to the speech processor (10). Alternate embodiments of the invention might omit some or all of the pre-processing performed for the envelope processor (10).

What is claimed is:

1. A circuit producing an output signal indicative of speech present in communication signals that include noise and processed speech envelope signals, said circuit receiving noise and processed speech envelope signals at an input, said circuit comprised of:
   peak detector means for detecting a substantially peak signal value in said processed speech envelope signals and for producing a first signal, representative of said peak signal values;
   valley detector means for detecting a background noise level present in said processed speech envelope signals input to said valley detector means and for producing a second signal representative of said noise level;
   first comparator means coupled to said peak detector means and said valley detector means for comparing said first signal to said second signal and for producing, at an output, a first difference signal equal to the greater of said first and second signals; and
   second comparator means coupled to receive said first difference signal from said first comparator means and receiving said processed speech envelope signals, said second comparator means comparing said first difference signal to said processed speech envelope signals and producing an output signal indicating when speech is present in a communications signal based on the comparison of said first difference signal to said processed speech envelope signals.

2. The circuit of claim 1 including first offset signal means for reducing the first signal from said peak detector means by a first predetermined amount before said first signal is coupled to said first comparator means.

3. The circuit of claim 2 including second offset signal means for increasing the second signal from said valley detector means by a second predetermined amount before said second signal is coupled to said first comparator means.

4. The circuit of claim 1 where said peak detector means comprises a voltage peak detector.

5. The circuit of claim 1 where said valley detector means comprises a noise level voltage detector.

6. The circuit of claim 1 where said first comparator means comprises a voltage comparator comparing the greater of said first and second signals and said first difference signal comprises the greater of said first and second signals.

7. The circuit of claim 6 where said first comparator comprises an ideal diode circuit coupled to said peak detector means and an ideal diode circuit coupled to said valley detector, said ideal diode circuits having outputs that are both connected to an input of said second comparator means.

8. The circuit of claim 1 where said comparator means comprises a two-input voltage comparator.

* * * * *